United States Patent [19]
Carman et al.

[11] Patent Number: 5,294,778
[45] Date of Patent: Mar. 15, 1994

[54] CVD PLATEN HEATER SYSTEM UTILIZING CONCENTRIC ELECTRIC HEATING ELEMENTS

[75] Inventors: Justice Carman, Valley Center; Mark A. Logan, Pleasanton; Joseph Monkowski, Danville, all of Calif.

[73] Assignee: Lam Research Corporation, Fremont, Calif.

[21] Appl. No.: 757,921

[22] Filed: Sep. 11, 1991

[51] Int. Cl.$^5$ .................... H01L 21/306; H01L 21/31
[52] U.S. Cl. ..................... 219/385; 219/445; 219/448; 392/418; 338/217; 118/725
[58] Field of Search ............... 219/385, 445-450, 219/455, 466; 392/416, 418; 338/285, 287, 283, 217, 218; 118/724, 725, 730

[56] References Cited
U.S. PATENT DOCUMENTS

| | | | |
|---|---|---|---|
| 1,975,410 | 10/1934 | Simpson | 338/217 |
| 2,093,939 | 9/1937 | Strack | 219/445 |
| 2,330,867 | 10/1943 | Challet | 219/446 |
| 3,381,114 | 4/1968 | Nakanuma | 338/217 |
| 4,511,789 | 4/1985 | Goessler et al. | 219/446 |

FOREIGN PATENT DOCUMENTS

| | | | |
|---|---|---|---|
| 3545443 | 6/1987 | Fed. Rep. of Germany | 219/445 |
| 59-44819 | 3/1984 | Japan | 118/728 |
| 61-142743 | 6/1986 | Japan | . |
| 63-196033 | 8/1988 | Japan | . |
| 2-27715 | 1/1990 | Japan | . |
| 3-80530 | 4/1991 | Japan | 118/725 |

*Primary Examiner*—Geoffrey S. Evans
*Assistant Examiner*—John A. Jeffery
*Attorney, Agent, or Firm*—James P. Hillman

[57] ABSTRACT

A wafer support platen heating system for low pressure chemical vapor deposition of apparatus includes multiple resistance heaters for individual heating of multiple portions of the platen to provide a predetermined uniform or non-uniform temperature gradient/profile across the platen. The multiple graphite resistance heaters of the preferred embodiment include a spiral shaped main resistance heater and two single turn edge loss graphite resistance heaters located within the inner diameter and along the periphery of the outer diameter respectively of the main spiral shaped resistance heater.

9 Claims, 6 Drawing Sheets

CVD PLATEN HEATER SYSTEM UTILIZING CONCENTRIC ELECTRIC HEATING ELEMENTS

BACKGROUND OF THE INVENTION

1. Field of the Invention

This invention relates to apparatus and methods for chemical vapor deposition of thin films on silicon wafers. More particularly, this invention relates to apparatus and methods for heating semiconductor wafers by creating a predetermined temperature profile across a support platen by means of multiple heaters.

2. Description of the Prior Art

In chemical vapor deposition systems, it is important to have complete control of heating the semiconductor wafer substrate. Sometimes it is necessary to heat the substrate uniformly. Non-uniform heating at these times can result in non-uniform deposition. At other times it is desirable to create a non-uniform temperature profile across the wafer in one direction while maintaining a uniform temperature profile in another direction. Chemical vapor deposition heating systems of the prior art, such as heat lamp or induction systems, have difficulty maintaining a desired heat profile across the wafers. These systems heat the wafer satisfactorily, but the difficulty occurs from their lack of control.

Since the chamber in which low pressure chemical vapor deposition occurs is evacuated during the operation, it is important that the voltage applied to the heater be kept low so as to prevent arcing across the terminals. There is a trade off of sufficient voltage to provide enough power to heat the wafer but not so much voltage as to initiate arcing across the heater terminals.

Accordingly, it would be desirable to have a platen heater for a chemical vapor deposition system that is capable of providing a desired temperature profile or gradient across a support platen. Furthermore it would be desirable to have a platen heater for a chemical vapor deposition system that has low cost and high efficiency. Furthermore, it would be desirable to have this platen heater operate at sufficiently low voltage as to inhibit arcing at the terminals or elsewhere (enhances personnel safety also). These benefits and others will become apparent as the platen heater system is described according to the teachings of the invention.

SUMMARY OF THE INVENTION

Briefly the present invention is a novel heating means and method for heating a chemical vapor deposition chamber wafer support platen by providing a desired uniform or non-uniform temperature profile across the platen as desired. The novel heating means of the invention is able to create this temperature profile or gradient because it comprises two or more individual heating means for heating at least first and second portions of the platen to predetermined temperatures. A preferred embodiment of the invention includes three or more individually controlled and powered heaters. The individual heating means of the invention could be any type of heater and take any desired shape. The preferred embodiments of the invention include resistance heaters formed in annular shapes. More particularly, the platen heating system includes a spiral shaped main resistance heater that defines both an inner space (that area within what would be referred to as the inner diameter if the main heater was circular) and an outer space (that area outside what would be referred to as the outer diameter, if the main heater were circular). A circular shaped, single turn (alternate embodiments can have multiple turns if desired) resistance heater is located within the spiral shaped main heater's inner space. An additional single turn (multiple turns are optional) heater is located on the outside of the outer space of the spiral shaped main heater. Temperature sensing means such as a calibrated thermocouple may be located proximate the platen at predetermined locations to sense the temperature of the platen at those predetermined locations. Power control means can then adjust the power input to the individual platen resistance heaters to provide a uniform flat profile) or smooth temperature gradient profile across the platen as desired. In the preferred embodiment of the invention, the temperature sensing means are located proximate the inner space, middle and outer space, respectively of the main spiral heater.

BRIEF DESCRIPTION OF THE DRAWINGS

The invention may be better understood and further advantages and uses thereof more readily apparent, when considered in view of the following detailed description of exemplary embodiments, taken with the accompanying drawings in which.

DESCRIPTION OF THE PREFERRED EMBODIMENTS

There has been a long felt need in the chemical vapor deposition arts for a platen heating system that has low capital costs, efficient operation to provide low operating costs and moderate voltage requirements to prevent arcing in the vacuum environment of chemical vapor deposition apparatus, especially at the heater terminals. The platen heating system constructed according to the teachings of the present invention satisfies all these criteria. In addition, the platen heating system of the invention can provide a predetermined uniform (flat) or non-uniform (tilted) temperature profile/gradient across the platen as desired.

Figure 1:
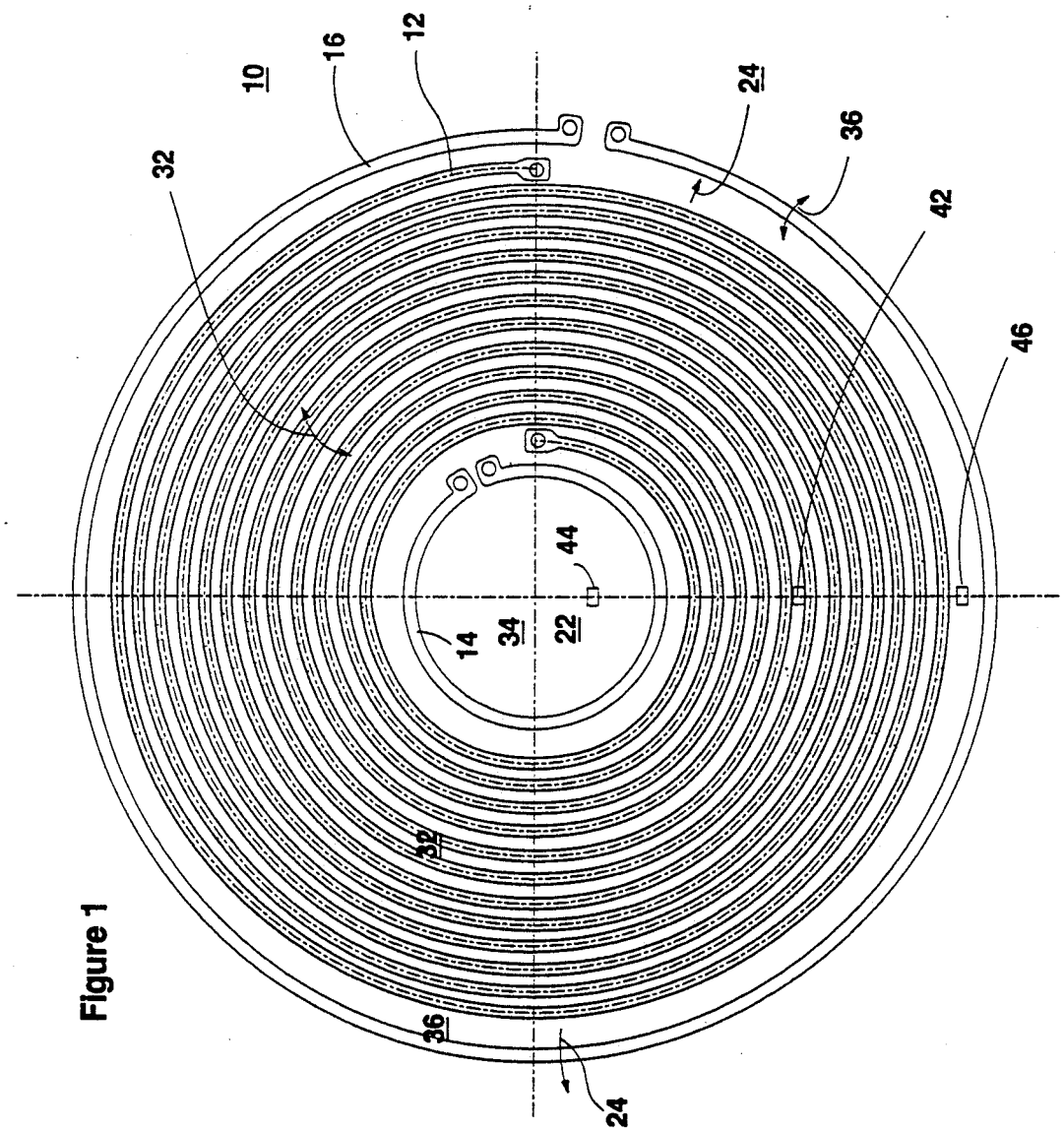
FIG. 1 is a schematic view of the multiple resistance heaters constructed according to the teaching of the invention.

Referring now to the drawings and to FIG. 1 in particular there is shown platen heating system 10 constructed according to the teachings of the invention. Platen heating system 10 includes individual resistance heaters 12, 14, and 16 respectively. Resistance heaters 12, 14, and 16 may be made from standard resistance or graphite and coated with silicon carbide after suitable surface preparation including purification. Resistance heater 12 is the main heater for platen heating system 10 and is in the shape of a spiral defining an inner spaced 22 and an outer space 24 respectively. Inner space 22 and outer space 24 may be thought of at the space within and without the inner diameter and outer diameter, respectively, of main heater 12, if main heater 12 was circular shaped. Main resistance heater 12 provides uniform heat except at inner and outer spaces 22 and 24 respectively. Single turn edge loss resistance heaters 14 and 16 respectively provide the capacity to heat the portion of the platen within the inner space 22 and the portion of the platen near the inner periphery of the outer space 24. Therefore three heat zones with individually controllable power supplies (any type of resistance heater power supply, as is well known in the art, may be used - generally three zone SCR fixed control) are created and are shown generally at 32, 34, and 36 respectively and correspond to spiral resistance heater 12, inner edge loss heater 14 and outer edge loss heater 16 respectively. Three temperature sensors shown at 42, 44 and 46 sense the platen temperature of the three heat zones 32, 34 and 36 respectively and provide feedback to the operator. The operator may then adjust the set points. In this way, platen heating system 10 will indicate when the predetermined temperature gradient has been created by the individual heaters 12, 14 and 16 or whether the power input to the individual heaters 12, 14 and 16 must be adjusted. Although a manual adjustment scheme has just been described for purposes of illustration, it is to be understood the teachings of the invention encompass an automated control such as, for example a microprocessor or computer controlled system.

Figure 2:
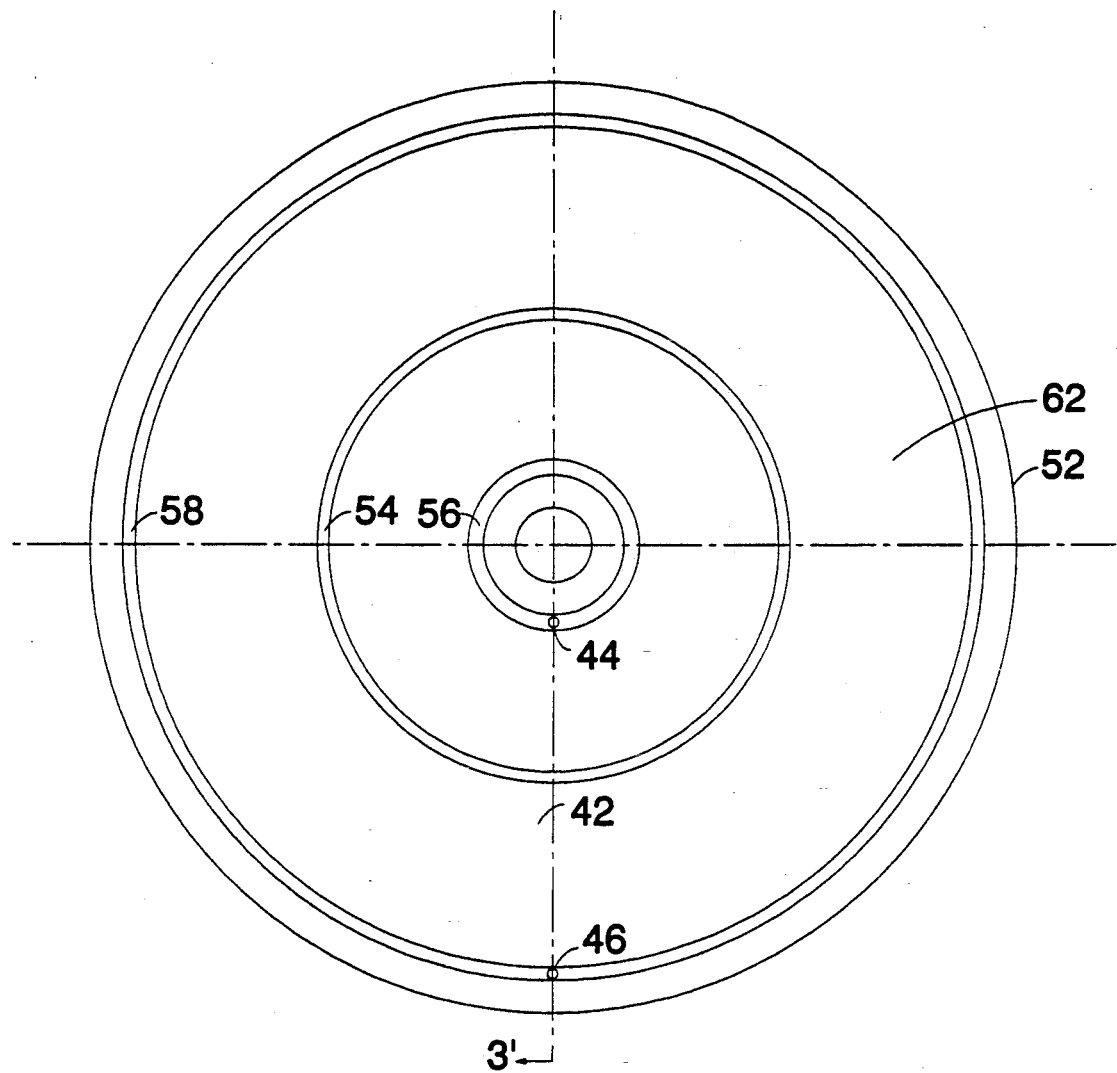
FIG. 2 is a bottom view of the support platen constructed according to the teachings of the invention, showing the recessed grooves for the temperature sensing means.
Figure 3:
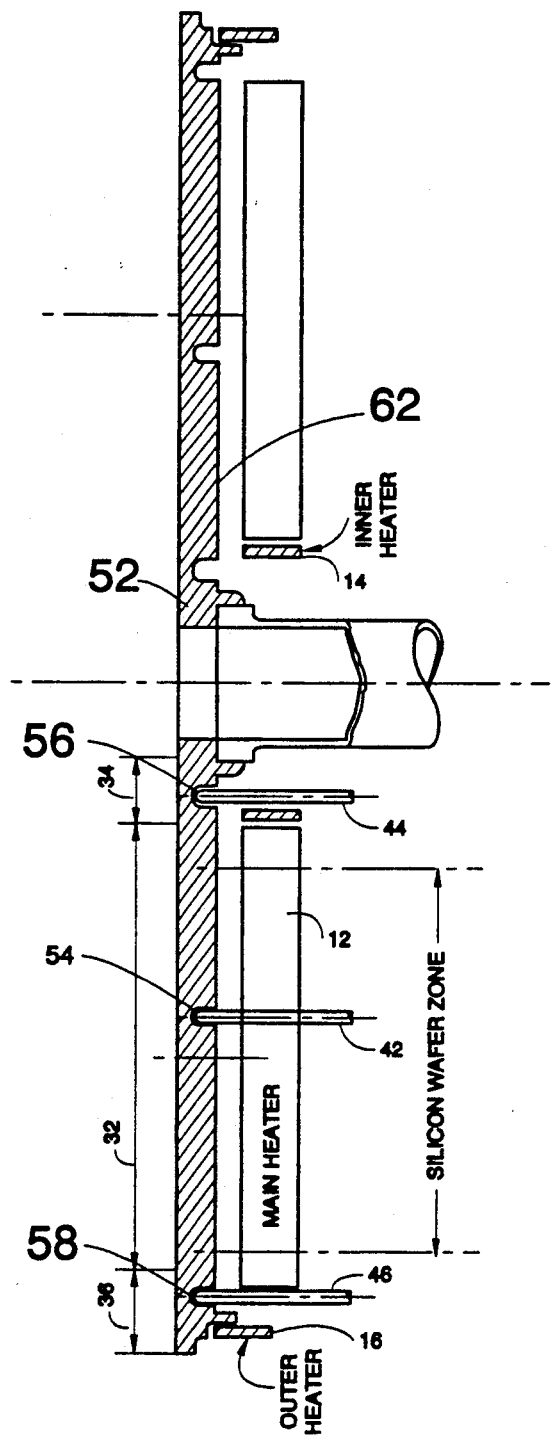
FIG. 3 is a cross sectional view of the support platen of FIG. 2 taken along the line 3'—3' showing the location of the multiple resistance heaters and temperature sensors of FIG. 1.

Referring now to FIGS. 2 and 3, there are shown a bottom view and cross sectional view along the lines 3'—3', respectively, of support platen 52. Support platen 52 has recessed grooves 54, 56 and 58 machined into its bottom surface. Temperature sensors 42, 44 and 46, are mounted to fit within grooves 54, 56 and 58, respectively, as shown in FIG. 3. Also shown in FIG. 3 is the location of main spiral resistance heater 12 and edge loss heaters 14 and 16, respectively, directly below and proximate bottom surface 62 of support platen 52.

Figure 4:
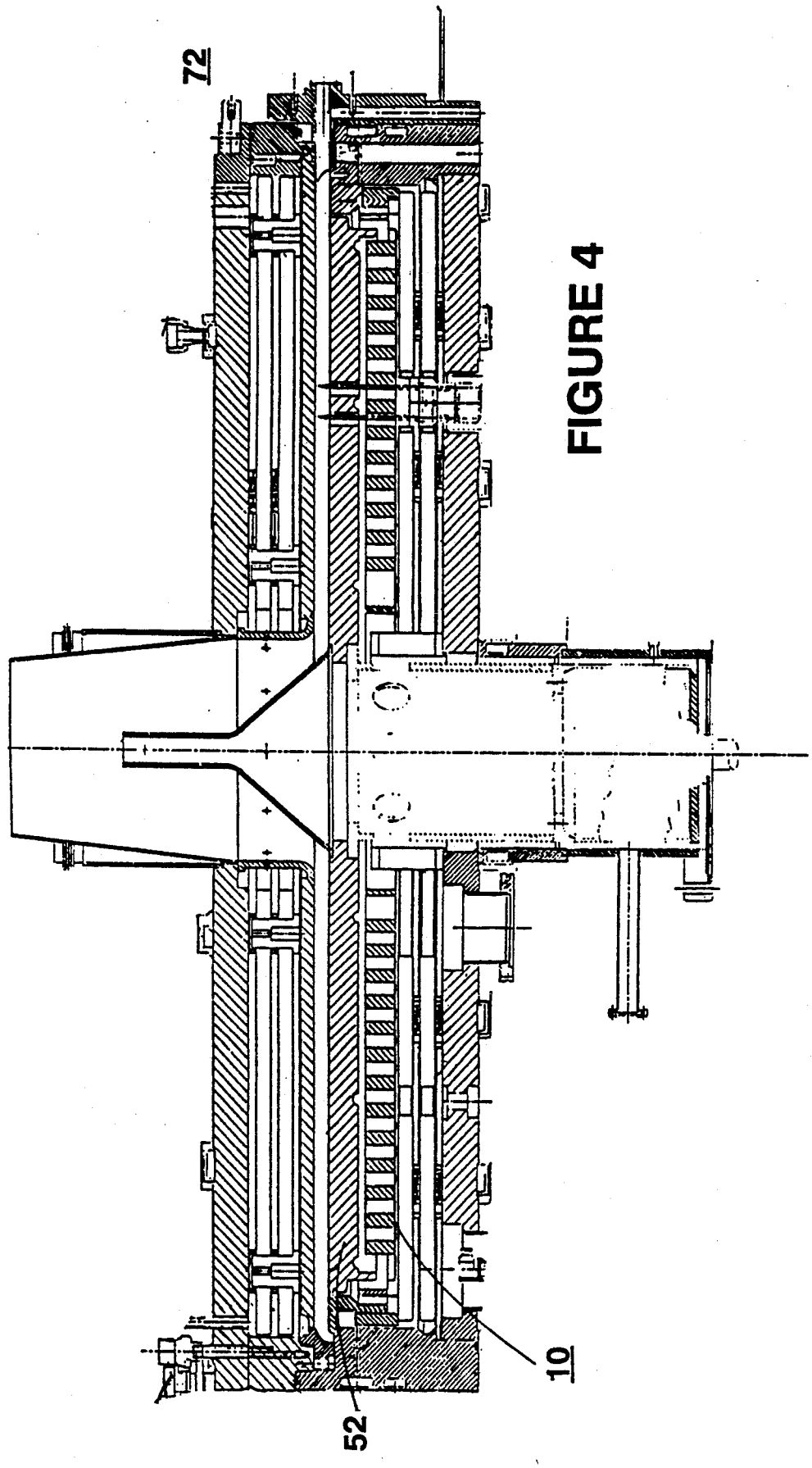
FIG. 4 is a cross sectional view of a chemical vapor deposition reaction chamber constructed according to the teachings of the invention, showing the location of the support, platen of FIG. 2 and the multiple resistance heaters of FIG. 1.

Referring now to FIG. 4, there is shown a cross sectional view of chemical vapor deposition reaction chamber 72 constructed according to the teachings of the invention. FIG. 4 shows the location of support platen 52 and platen heating system 10 within chemical deposition reaction chamber 72. Platen heating system 10 is mounted stationary within chemical vapor deposition reaction chamber 72 while wafer support platen 52 is rotatably mounted within chemical vapor deposition reaction chamber 72.

Figure 5:
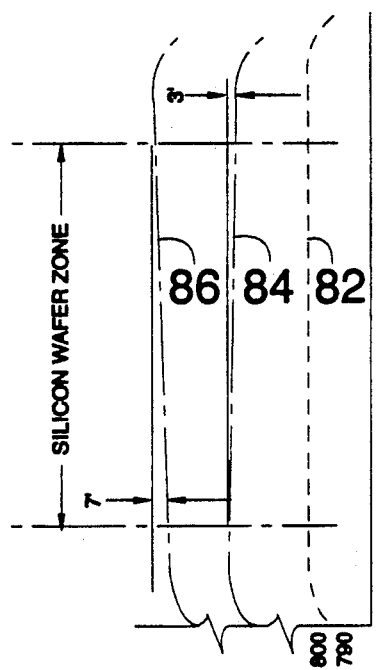
FIG. 5 is a graph of several possible platen temperature profiles.

In operation, chemical vapor deposition reaction chamber 72 wafer support platen 52 is rotated slowly while power is applied to stationary heating system 10, whereupon support platen 52 and any semiconductor wafers supported thereon are raised to a predetermined temperature, for instance 800 degrees Fahrenheit. Referring now to FIG. 3, main spiral heater 12, heats heat zone 32 while edge loss heaters 14 and 16 heat heat zones 34 and 36, respectively. Referring now to FIG. 5, since all three individual heaters 12, 14 and 16 are individually powered and controlled, the temperature of each individual heat zone 32, 34 and 36 may adjusted to provide either a flat uniform temperature profile across support platen 52 such as shown generally at graph 82, or the temperature of support platen 52 may be adjusted slightly greater at either inner heat zone 34 or outer heat zone 36 by simply turning up the power on inner edge loss heater 14 or outer edge loss heater 16 as shown generally at graphs 84 and 86, respectively. Since support platen 52 is slowly rotating, it can be seen that a uniform temperature profile is maintained across support platen 52 in the circumferential direction while the temperature profile in the radial direction can be tilted slightly, that is raised slightly in the center or at the periphery of the support platen 52, as illustrated in graphs of 84 and 86. A typical range of temperature elevations for the tilt is 1°-30°.

Figure 6:
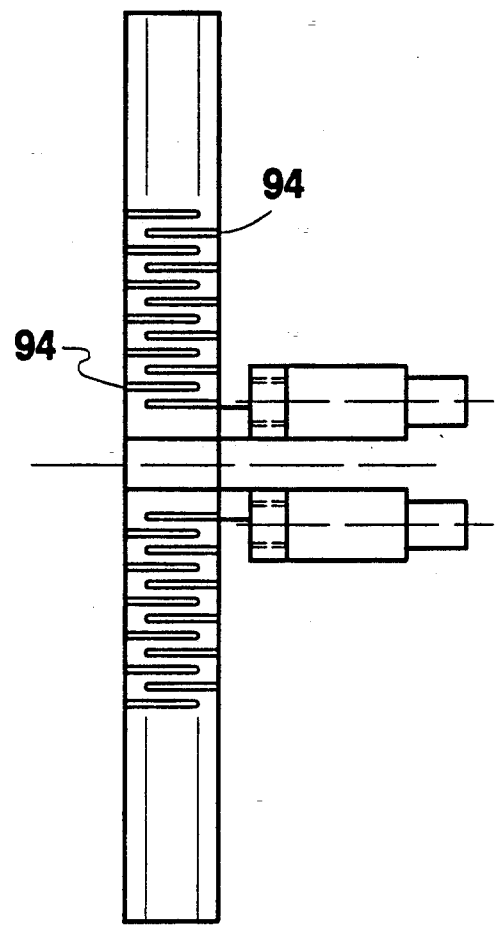
FIG. 6 depicts an alternate embodiment of a single turn edge loss heater having portions removed along its length.

Referring now to FIG. 6 there is shown an alternate embodiment of a single turn edge loss heater 92 that may used for either inner or outer edge loss heaters 14 and 16 respectively. Edge loss heater 92 has portions along its length removed such as slots 94 to increase its resistance by presenting a convoluting path for current flow. Another alternative would be to use wire wound in a spiral for the single turn edge loss heaters length.

In conclusion, the present invention discloses means and methods for creating a uniform circumferential temperature gradient and a non-uniform radial temperature gradient across a CVD reaction chamber support platen. The invention teaches the use of multiple, individual, independently powered heating means such as multiple resistance heaters disposed in fixed radial positions along a support platen while the support platen is rotatably disposed within the reaction chamber. By simply adjusting the power applied to the independent heating means, a uniform flat or non-uniform tilted radial temperature profile can be created. When the platen is rotated, the circumferential temperatures along the platen will be integrated to create a uniform circumferential temperature gradient/profile even when the platen is subject to the non-uniform radial temperature gradient. The non-uniform radial temperature gradient/profile can be tilted in a range from one to thirty degrees centigrade towards either the center or the periphery of the support platen. The use of multiple independent heating means provides for reducing the voltage requirements of each individual heating means. Operating the heating system at reduced voltages provide greater safety for operating personnel and inhibits arcing at the heater terminals.

I claim:

1. A heating system for heating a chemical vapor deposition reaction chamber support platen, comprising:
    a) first and second heating means for heating first and second portions of said platen;
    b) first and second temperature sensing means for sensing the temperature of said first and second portions of said platen respectively;
    c) first and second power control means responsive respectively to said first and second temperature sensing means for varying the power input to said first and second heating means to provide individual temperature control of said first and second portions of said platen;
    d) a third heating means for heating a third portion of the platen;
    e) a third temperature sensing means for sensing the temperature of said third portion of the platen; and
    f) a third power control means for varying the power input to said third heating means to provide individual temperature control of said third portion of the platen;

wherein the first heating means has a spiral shape defining both an inner diameter and an outer diameter, the second heating means has a single turn circular shape and the third heating means has a single turn circular shape, the second heating means has a diameter less than the inner diameter of the first heating means and is located within the inner diameter of the first heating means, the third heating means as a diameter greater than the outer diameter of the first heating means and is located outside the outer diameter of the first heating means.

2. The platen heating system of claim 1 wherein the first, second and third heating means are resistance heaters.

3. The platen heating system of claim 2 wherein the first, second and third resistance heaters are made of graphite and coated with silicon carbide.

4. The platen heating system of claim 2 wherein the first, second and third resistance heaters are made of one of the materials from the group nickel chromium, tungsten or other standard resistance wire.

5. The platen heating system of claim 2 wherein the third graphite resistance heater has portions missing along its length to provide a convoluted path and thereby increased resistance to current flow.

6. The platen heating system of claim 2 wherein the third graphite resistance heater is made of wire wound in a spiral to provide increased resistance.

7. The platen heating system of claim 5 wherein the third graphite resistance heater has a cylindrical shape having both a top and bottom surface and wherein the missing portions are slits disposed along the top and bottom surfaces to a predetermined depth.

8. The platen heating system of claim 5 wherein the second graphite resistance heater has portions removed along its length to provide a convoluted path for current flow and increased resistance to reduce current flow.

9. The platen heating system of claim 8 wherein the second graphite resistance heater has a cylindrical shape having a top and bottom surface and inner and outer sidewall surfaces and wherein the removed portions ar slits disposed along either the top or bottom surface at predetermined locations and to predetermined depths along the inner and outer sidewall surfaces.

* * * * *